(12) United States Patent
Ellä et al.

(10) Patent No.: US 10,079,586 B2
(45) Date of Patent: Sep. 18, 2018

(54) PACKAGE FOR A TUNABLE FILTER

(71) Applicant: SNAPTRACK, INC., San Diego, CA (US)

(72) Inventors: Juha Ellä, Halikko (FI); Edgar Schmidhammer, Stein an der Traun (DE); Christian Block, Stainz (AT)

(73) Assignee: SnapTrack, Inc., San Diego, CA (US)

(*) Notice: Subject to any disclaimer, the term of this patent is extended or adjusted under 35 U.S.C. 154(b) by 104 days.

(21) Appl. No.: 15/118,853

(22) PCT Filed: Jun. 10, 2014

(86) PCT No.: PCT/EP2014/062009
§ 371 (c)(1),
(2) Date: Aug. 12, 2016

(87) PCT Pub. No.: WO2015/128008
PCT Pub. Date: Sep. 3, 2015

(65) Prior Publication Data
US 2017/0222614 A1    Aug. 3, 2017

(30) Foreign Application Priority Data

Feb. 26, 2014 (DE) .................. 10 2014 102 518

(51) Int. Cl.
| H03H 7/01 | (2006.01) |
| H03H 9/46 | (2006.01) |
| H03H 7/46 | (2006.01) |

(52) U.S. Cl.
CPC ........ *H03H 7/0153* (2013.01); *H03H 7/0115* (2013.01); *H03H 7/463* (2013.01); *H03H 9/465* (2013.01)

(58) Field of Classification Search
CPC .... H03H 7/0153; H03H 7/0115; H03H 7/463; H03H 9/465

(Continued)

(56) References Cited

U.S. PATENT DOCUMENTS 7,160,476 B2    1/2007  Weekamp
2003/0218514 A1* 11/2003  Eckl .................. H03H 7/0115
                                                                     333/32

(Continued)

FOREIGN PATENT DOCUMENTS

| DE | 3230738 C2 | 3/1983 |
| DE | 10340438 B4 | 4/2005 |
| DE | 60311982 T2 | 11/2007 |
| JP | H10209714 A | 8/1998 |
| JP | 2006279603 A | 10/2006 |
| JP | 2006303202 A | 11/2006 |
| JP | 2012235369 A | 11/2012 |

(Continued)

OTHER PUBLICATIONS

International Search Report and Written Opinion—PCT/EP2014/062009—ISA/EPO—dated Nov. 13, 2014.

(Continued)

*Primary Examiner* — Benny Lee
*Assistant Examiner* — Hafizur Rahman
(74) *Attorney, Agent, or Firm* — Patterson & Sheridan, L.L.P. Qualcomm

(57) ABSTRACT

A package for a tunable filter is disclosed. In an embodiment, the tunable filter includes a substrate having a first interconnection plane and a semiconductor device assembled on the substrate in a first component plane, the semiconductor device electrically connected to the first interconnection plane and containing tunable passive components. The filter further includes a control unit arranged in the first component plane, a dielectric layer arranged above the first component plane, a second component plane arranged on the dielectric layer and discrete passive devices arranged in the second component plane and interconnected with the semiconductor device, wherein the tunable passive components are tunable by the control unit.

21 Claims, 4 Drawing Sheets

(58) Field of Classification Search
USPC .......................................................... 333/2
See application file for complete search history.

(56) References Cited

U.S. PATENT DOCUMENTS

| | | |
|---|---|---|
| 2005/0143023 A1 | 6/2005 | Shih |
| 2007/0108584 A1 | 5/2007 | Fluhr et al. |
| 2013/0147574 A1 | 6/2013 | Wada |
| 2013/0244591 A1 | 9/2013 | Weissman et al. |
| 2016/0359466 A1* | 12/2016 | Schmidhammer ... H03H 7/0115 |

FOREIGN PATENT DOCUMENTS

| | | |
|---|---|---|
| WO | 2011053888 A1 | 5/2011 |
| WO | 2012020613 A1 | 2/2012 |
| WO | 2012027703 A2 | 3/2012 |
| WO | 2013105397 A1 | 7/2013 |
| WO | 2013142527 A1 | 9/2013 |

OTHER PUBLICATIONS

Brank, J. et al., "RF MEMS-Based Tunable Filters," International Journal of RF and Microwave Computer-Aided Engineering, vol. 11, Issue 5, Sep. 2001, pp. 276-284.

Inoue, H. et al., "A Novel Tunable Filter Enabling both Center Frequency and Bandwidth Tunability," Proceedings of the 42nd European Microwave Conference, Oct. 29-Nov. 1, 2012, pp. 269-272.

Kadota, M. et al., "Tunable Filters Using Wideband Elastic Resonators," IEEE Transactions on Ultrasonics, Ferroelectrics, and Frequency Control, vol. 60, No. 10, Oct. 2013, pp. 2129-2136.

Mi, X. et al., "Integrated Passives for High-Frequency Applications," Advanced Microwave Circuits and Systems, Apr. 2010, pp. 249-290.

Nanver, L.K. et al., "Improved RF Devices for Future Adaptive Wireless Systems Using Two-Sided Contacting and AlN Cooling," IEEE Journal of Solid-State Circuits, vol. 44, No. 9, Sep. 2009, pp. 2322-2338.

Ru, Z. et al., "A 300-800 MHz Tunable Filter and Linearized LNA Applied in a Low-Noise Harmonic-Rejection RF-Sampling Receiver," IEEE Journal of Solid-State Circuits, vol. 42, No. 5, May 2010, pp. 967-978.

Tourret, J.R. et al., "SiP Tuner With Integrated LC Tracking Filter for Both Cable and Terrestrial TV Reception," IEEE Journal of Solid-State Circuits, vol. 42, No. 12, Dec. 2007, pp. 2809-2821.

Wada, T. et al., "Tunable Isolator using Variable Capacitor for Multi-Band System," IEEE MTT-S International Microwave Symposium Digest, Jun. 2-7, 2013, 3 pages.

* cited by examiner

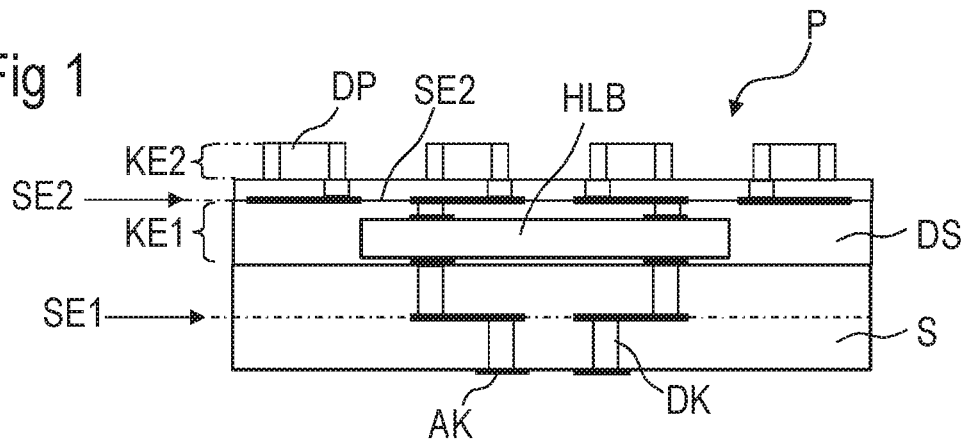
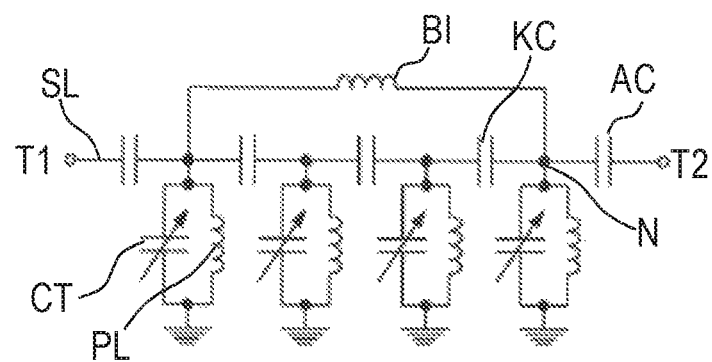
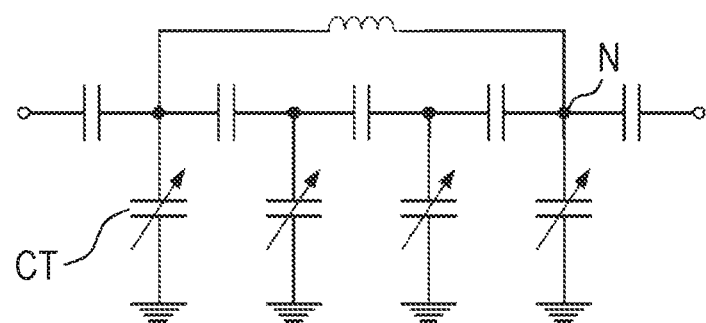
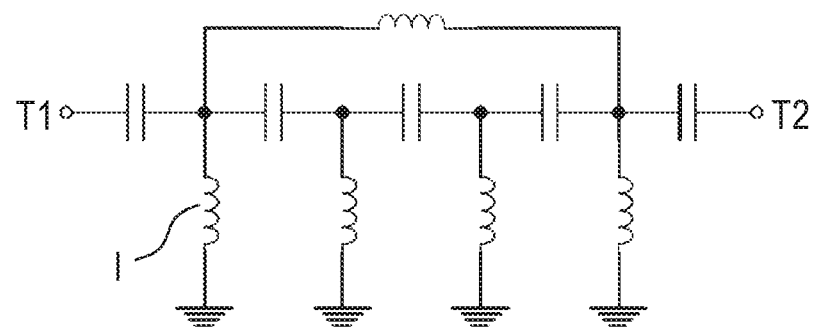

PACKAGE FOR A TUNABLE FILTER

This patent application is a national phase filing under section 371 of PCT/EP2014/062009, filed Jun. 10, 2014, which claims the priority of German patent application 10 2014 102 518.0, filed Feb. 26, 2014, each of which is incorporated herein by reference in its entirety.

TECHNICAL FIELD

The invention relates to a package for a tunable filter, as can find use in, e.g., communication instruments which are not cable bound.

BACKGROUND

Portable communication devices, WLAN routers, etc. or, more generally: transmission/reception apparatuses which communicate by means of RF signals, require RF filters in order to separate desired from undesired signals. By way of example, such filters can be interconnected in front-end circuits, e.g., in duplexers.

Here, the filter should assume the object of distributing the signals between a chipset and optionally additionally present filters. The circuit outlay should be as little as possible. The filter should be compatible with a multiplicity of different filter technologies of further filters, enable a small installation size of a corresponding device and, in particular, permit a high selectivity.

The trend toward communication devices which can handle ever more frequency bands leads to complicated interconnections of various filters for the different frequency bands. Therefore, the need arises for tunable filters in order to be able to use different frequency bands with the same filter.

Previous solutions to these requirements are substantially based on extending known filter circuits by tunable impedance elements, or based on the use of switches, by means of which filter elements can be switched into a filter topology.

The contribution "Tunable Filters Using Wideband Elastic Resonators", Kadota et al., IEEE Transactions on Ultrasonics, Ferroelectrics and Frequency Control, vol. 60, no. 10, October 2013, pages 2129-2136, has disclosed filter circuits, in which tunable capacitors are added to RF filters with acoustic resonators.

The contribution "A Novel Tunable Filter Enabling Both Center Frequency and Bandwidth Tunability", Inoue et al., Proceedings Of The 42nd European Microwave Conference, 29 Oct.-1 Nov. 2012, Amsterdam, The Netherlands, pages 269-272, has disclosed RF filters with tunable capacitors and tunable inductances.

The contribution "RFMEMS-Based Tunable Filters", Brank et al., 2001, John Wiley & Sons, Inc. Int J RF and Microwave CAE11: pages 276-284, 2001, has also disclosed interconnections of L and C elements, with the capacitances of the capacitive elements being adjustable.

The contribution "Tunable Isolator Using Variable Capacitor for Multi-band System", Wada et al., 978-1-4673-2141-/13/S31.00, 2013 IEEE MTT-S Symposium or the publication document WO2012/020613 has disclosed the use of insulators in RF filters. In general, tunable filters require a multiplicity of components, which is greater than that of conventional known filters tuned to one frequency band. Moreover, there is more complicated interconnection which causes further problems as conductor track crossings and the couplings connected therewith are practically unavoidable.

The multiplicity of additionally required components for tunable filters moreover leads to more space being required.

SUMMARY OF THE INVENTION

Embodiments of the present invention specify a package for a tunable filter, which is realizable with a compact design and which avoids bothersome couplings.

The basic concept of the invention lies in providing a package with 3D integration and, in the process, separating certain components of higher and lower quality from one another.

Thus, a package according to the invention has a substrate, which serves as a carrier for the tunable filter and which moreover has at least one interconnection plane. A semiconductor device is assembled on the top side of the substrate in a first component plane and it is electrically connected to the first interconnection plane. The semiconductor device has high-quality tunable passive components which enable frequency tuning of the filter.

Furthermore, a control unit is arranged in the first component plane. The control unit is configured to actuate the tunable components and thus establish a switching state which is distinguished by a desired cutoff frequency or a desired frequency band.

Arranged above the first component plane is a dielectric layer. The dielectric layer preferably has an at least largely leveled surface.

Situated above the dielectric layer is a second component plane, in which discrete passive devices, which are interconnected with the semiconductor device, are arranged.

A filter which is tunable in respect of the cutoff frequency thereof or the frequency band thereof is realized from the tunable passive components, the discrete passive devices and, optionally, further components. Such a filter can be embodied as a bandpass filter. However, it is also possible to embody the filter as a high-pass filter or as a low-pass filter. A bandstop filter is also realizable as tunable filter.

The tunable passive components in the semiconductor device can be manufactured in an integrated manner and can be interconnected with one another in an integrated manner. In the semiconductor device, these components can be distributed over the area of the semiconductor device.

The high-quality discrete devices arranged in the second component plane, i.e., above the semiconductor device, can then be provided at an ideally small distance from, or directly over, circuit nodes or contact faces of the semiconductor device such that it is possible to realize the shortest possible electrical connections between the circuit nodes of the semiconductor device and the discrete passive devices. Short electrical connections only have a small parasitic effect in terms of magnitude, and so only minor couplings may occur between the connection lines between the discrete passive devices and the semiconductor device or between the connections of these components amongst themselves. Small couplings are advantageous in that the filter has a high frequency accuracy, a high edge steepness and few electrical losses.

A further advantage consists of the fact that the 3D integration of the components of the filter, or the package itself, only requires a small base area. As a result of long connection lines being saved, the package according to the invention also has a lower volume in the package than conventional tunable filters.

If components having a quality factor of at least 100 are selected for the high-quality components, i.e. for the discrete devices and the high-quality tunable components, it is possible to obtain filters which have a tuning factor of up to 4:1. Converted to frequency, this corresponds to a factor of 2 between the lowest and highest adjustable cutoff frequency or frequency range.

In accordance with one embodiment, the tunable passive components are configured as tunable high-quality capacitors. Such high-quality tunable capacitors can be varactors or switchable capacitances and can be integrated into the semiconductor device. Accordingly, the discrete passive devices are configured as high-quality inductances in this embodiment.

Varactors are semiconductor devices which have a voltage-dependent capacitance. That is to say, the capacitance thereof can be adjusted by way of a control voltage. Therefore, varactors can be realized up to 100 percent in the semiconductor device. They can be embodied using various technologies. Varactors are known on the basis of silicon and also on the basis of compound semiconductors such as, in particular, gallium arsenide. High-quality varactors are described in e.g. L. K. Nanver et al., "Improved RF Devices for Future Adaptive Wireless Systems Using Two Sided Contacting and AlN Cooling" IEEE JOURNAL OF SOLID-STATE CIRCUITS, VOL. 44, NO. 9, SEPTEMBER 2009, pages 2322-2338. However, it is also possible to embody the switchable capacitances as thin-film capacitors (MIM capacitor=metal isolator metal) and to switch these into a circuit by means of semiconductor switches such as, e.g., transistors or diodes or to separate said capacitors from the circuit. By parallel connection of a plurality of thin-film capacitors which can be switched in, it is possible to set a desired capacitance value. Moreover, a frequency can be adjusted with high accuracy by way of the number and size distribution of the capacitors, which can be switched in and which are provided for a tunable capacitance.

High-quality discrete inductances are usually embodied in the form of coils. These can be printed coils. It is also possible to use coils which are folded in three dimensions or which are even wound. Furthermore, it is possible to integrate a plurality of high-quality inductances into a device.

A discrete filter circuit, by means of which a tunable filter can be obtained, comprises a serial signal line, which has at least four circuit nodes. At each circuit node, a parallel branch is coupled to ground, in which parallel branch a high-quality tunable reactance element is arranged in each case. Depending on the type of the tunable reactance element, it can be arranged in the first component plane or in the second component plane.

A coupling capacitance or a coupling inductance is arranged in the serial signal line of the tunable filter circuit, between respectively two adjacent circuit nodes. Said coupling capacitance or coupling inductance does not require high quality as it does not have a substantial influence on the filter behavior. Therefore, the coupling capacitance or the coupling inductance can be embodied as an integrated component. The semiconductor device lends itself as a location of integration. However, it is also possible to provide the coupling capacitance or coupling inductance in the substrate, which is then embodied as a multi-layer substrate, in which the coupling capacitance or the coupling inductance is integrated together with further low-quality passive components. It is also possible to couple the reactance elements passively to one another only by way of parasitic couplings, i.e. without connecting a capacitor therebetween, which can be carried out, in particular, by an arrangement in spatial proximity.

One capacitor is respectively arranged at the end on both sides of the serial signal line for adjusting the termination impedance and input impedance. Input impedance and output impedance are usually constant, but can also be variable and can be controlled with the aid of tunable capacitors. By way of example, the input impedance in one exemplary embodiment can be changed from 5Ω to 5Ω purely by varying the input-side capacitance.

Further capacitances serve to couple the serial signal line at the end on both sides to external circuit surroundings, wherein electrical radiofrequency signals can be fed into the serial signal line from both directions by way of these coupling capacitors at the ends. These input coupling capacitors and output coupling capacitors can also be embodied in a tunable manner.

The circuit nodes at the end of the signal line are connected to one another by way of a bridging inductance or a bridging capacitance connected in parallel with the serial signal line. This bridging inductance or bridging capacitance can also be embodied as a low-quality component and, for example, be embodied in the semiconductor device, in the substrate or in a different interconnection plane.

The reactance element arranged in each case in the parallel branches can be a parallel resonant circuit, which in each case comprises a parallel connection of a high-quality tunable capacitor and a high-quality inductance. In this embodiment, the filter circuit is effective as a bandpass filter.

Furthermore, the reactance element in the parallel branches can be a series inductance. The latter also has a high-quality embodiment and, in particular, it is arranged as discrete passive component in the second component plane. The associated filter circuit is effective as a high-pass filter.

In a further refinement, the reactance element is a high-quality tunable capacitance. Such a filter circuit is effective as a low-pass filter.

In a further refinement, the reactance element is embodied as a series connection of a tunable high-quality capacitance and a high-quality inductance. Such a filter circuit is effective as a bandstop filter. A bandstop filter is distinguished by a cutoff region, which ranges from a narrowband notch frequency to a broad cutoff region of e.g. fifty percent of relative bandwidth.

Inductive components can have inductive coupling amongst themselves, which acts over space and therefore is relatively far-reaching. In one embodiment, in order to minimize the coupling of the high-quality discrete inductances arranged in the second component plane, the inductances are embodied as SMD components, are arranged with a linear alignment and aligned in such a way that the magnetic axes of in each case two SMD components arranged next to one another are rotated by approximately 90° with respect to one another. Since maximum inductive coupling only occurs in the case of a parallel alignment of the axes, each deviation from the parallel alignment leads to a reduction in the coupling, which tends to zero in the case of a mutual alignment at an angle of 90°. If similar, high-quality discrete inductances are provided, it is expedient to rotate the respectively adjacent components in the linear arrangement of the components with respect to one another through an angle of 90° with respect to the preceding one with the same sense of rotation. In this manner, four different arrangements per device are possible, by means of which the coupling is further reduced.

In the package according to the invention, the control unit and all components required for the filter circuit can be combined depending on requirements, technology, desired quality and, not least, according to combinability. Thus, it is possible, for example, to integrate the control unit into the semiconductor device together with the tunable passive components. It is also possible to provide the control unit separately from the tunable passive components in a further semiconductor device.

Furthermore, low-quality passive components of the filter circuit can also be realized in the semiconductor device in addition to the high-quality components.

In a further refinement, all low-quality passive components, i.e. the low-quality capacitors and inductances, can be realized in a further semiconductor device which is e.g. likewise arranged in the first component plane, directly applied to the substrate and electrically connected thereto.

The devices of the second component plane can be connected to the semiconductor device or devices in the first component plane directly through the dielectric layer by way of via holes. However, it is also possible to introduce a further interconnection plane between the first component plane and the second component plane, which further interconnection plane can be realized between two partial layers of a dielectric layer. A more complex interconnection can be achieved by way of such an interconnection plane, particularly if individual discrete passive devices of the second component plane cannot be arranged directly over the circuit nodes with which they are electrically connected.

In a further embodiment of the invention, all tunable, high-quality passive components, the control unit and the low-quality passive components are realized in a single semiconductor device.

Moreover, the low-quality passive components can be realized in an integrated passive device, a so-called IPD, which can be arranged in the first component plane or second component plane.

An integration of passive components into the substrate is successful if the latter has a multi-layer structure and, for example, if it is embodied as an LTCC (=low-temperature co-fired ceramic) or as an HTCC (=high-temperature co-fired ceramic) or as a multi-layer laminate.

On the lower side thereof, i.e. on the surface of the substrate facing away from the component plane, the package according to the invention has external contacts, by means of which the tunable filter or the tunable filter circuit is, or can be, electrically connected to external circuit surroundings. The external contacts are connected to components in the first component plane by way of via holes with an interconnection plane realized in, or on, the substrate or directly by way of via holes. If an interconnection plane is arranged in the substrate, the former is also connected to the components of the first component plane by way of via holes. If the interconnection plane is arranged on the top side of the substrate below the first component plane, the components of the first component plane can be connected directly to the interconnection plane, for example by direct soldering or by means of bumps.

In a further embodiment of the package according to the invention, provision is made of integrating further components into the package, which further components can be interconnected with the tunable filter in order to realize larger and more complex circuits. Such further components can be selected from a power amplifier, an LNA, an acoustic filter, a duplexer, a diplexer and general radiofrequency semiconductor devices. Two or more tunable filters can be realized in the package, which filters are interconnected together to form a diplexer, duplexer or, in general, a multiplexer. The additional passive components generally required for a multiplex for separating the multiplexer outputs can likewise be integrated into the package. The package can also realize a filter bank, the different, possibly tunable filters of which can be operated independently of one another.

In the package, a tunable filter can be interconnected with an acoustic filter with a fixedly set frequency such that a duplexer with a different duplex separation can be realized in this manner. The radiofrequency semiconductor device can comprise a transceiver circuit which serves for further processing of the RF signal filtered by the filter.

In a further embodiment, the tunable capacitors are embodied as an array of switchable MEMS capacitors (=micro-electromechanical system) or as switchable MIM capacitors (=metal/insulator/metal layer sequence). The MEMS capacitors can be embodied in a semiconductor substrate by microstructuring and share the same substrate with semiconductor circuits. MIM capacitors can likewise be integrated into the semiconductor device, for example in the form of alternating metal and insulating layers, which are deposited on the surface of the semiconductor device and structured accordingly. Furthermore, it is possible to embody capacitors like in the case of semiconductor memories and, for example, to realize these as trenches or holes in the substrate which are filled or cladded with metal.

In one embodiment, the array of switchable capacitors is connected to the control unit, which interconnects a desired selection or number of capacitors to one another in parallel in order to provide the desired capacitance value. The resonant frequency of resonant circuits, in particular of series and parallel resonant circuits, is adjusted by way of the set capacitance value and hence the filter is tuned to a desired cutoff frequency or a desired frequency band.

BRIEF DESCRIPTION OF THE DRAWINGS

Below, the invention is explained in more detail on the basis of exemplary embodiments and the associated figures.

The figures only serve for the better understanding of the invention and are therefore only schematic and not necessarily embodied true to scale. Therefore, it is not possible to gather either relative or absolute dimensional specifications from the figures. The same or equally acting parts are provided with the same reference signs.

FIG. 1 shows a schematic cross section of a package for, and with, a tunable filter.

FIGS. 2A to 2E show five embodiments of tunable filters in a block diagram.

DETAILED DESCRIPTION OF ILLUSTRATIVE EMBODIMENTS

Figure 2D:
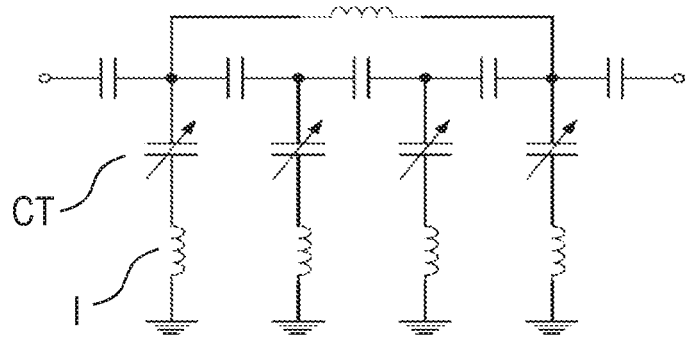

FIG. 1 shows a simple exemplary embodiment of a package according to the invention. The package is built up on a substrate S, which is a single-layer or multi-layer substrate and has at least one interconnection plane SE1. The interconnection plane SE1 can be embodied on the surface of the substrate S or, as depicted in FIG. 1, between two insulating layers of a multi-layer substrate. At least one semiconductor device HLB is assembled on the substrate and electrically connected to the first interconnection plane SE1. In addition to the semiconductor device HLB, further discrete, integrated or other devices (not depicted in the figure) can be arranged on the substrate in the first component plane KE1. The semiconductor device HLB comprises at least high-quality tunable passive components.

A control unit can be integrated into the semiconductor device HLB. A control unit can also be realized as a further separate semiconductor device and arranged in the first component plane KE2.

The devices of the first component plane are covered by a dielectric layer DS or embedded in a dielectric layer DS, which terminates to the top with an approximately plane surface. A second component plane KE2 is provided above the dielectric layer DS and the first component plane KE1, which is arranged covered below, or embedded within, said dielectric layer. Discrete, high-quality passive devices DP are arranged in said second component plane. The discrete high-quality passive devices DP are electrically interconnected with the components of the first component plane KE1. This can be carried out directly by way of via holes from the devices of the second component plane to the contacts of the semiconductor devices HLB in the first component plane. However, as depicted in the figure, it is also possible to provide a second interconnection plane SE2 between the first component plane KE1 and the second component plane KE2. The line sections of the second interconnection plane SE2 are electrically connected to the corresponding contacts of the discrete passive devices DP and, moreover, to contacts of the semiconductor devices by means of via holes. The second interconnection plane SE2 can be embedded between two layers of a dielectric.

External contacts AK are provided at the lower side of the substrate S, which external contacts are connected by way of via holes DK either directly to the components of the first component plane KE1 or, as depicted in the figure, to the first interconnection plane SE1.

Further passivations or protective covers, which seal the components of the package P against environmental influences, are not depicted in FIG. 1. By way of example, such a passivation can be at least one layer deposited on or applied directly to the surface of the discrete passive devices DP, in particular a thin film. The passivation can also comprise a layer sequence of deposited or applied layers. By way of example, it is possible to apply a first interlocking cover to the discrete passive devices DP, which cover terminates with the surface of the dielectric layer DS. By way of example, this can be a thermoplastic film. This film can subsequently be provided with a metalization, which can optionally still be reinforced in an electrolytic or electroless manner.

It is also possible to enlarge the surface of the substrate S in relation to the region provided with components and to let the passivation terminate with the substrate surface which then protrudes. Furthermore, it is possible to place a rigid and mechanically dimensionally stable cap onto the surface of the dielectric layer DS or onto protruding surface regions of the substrate S and seal it against the latter. There can subsequently still be encapsulation of the entire package P, both in the case of an interlocking cover and in the case of a rigid cap, with, advantageously, either a glob top compound being applied or the entirety being injection molded with a plastic compound, e.g. by overmolding.

FIG. 2 shows various embodiments of tunable filters. Only exemplary topologies are depicted, and so further embodiments are conceivable. FIG. 2A shows a bandpass filter, which connects a first terminal T1 to a second terminal T2 using a serial signal line SL. At least four circuit nodes N, to which reactance elements are coupled, are provided in the serial signal line SL. A coupling capacitor KC is connected between in each case two circuit nodes N, by means of which coupling capacitor the reactance elements are coupled to one another. A bridging inductance BI is interconnected parallel to the serial signal line between the two outermost circuit nodes N of the serial signal line SL.

For a bandpass filter like in FIG. 2A, the reactance element is embodied e.g. as a parallel resonant circuit, in which a high-quality tunable capacitance CT is interconnected with a high-quality parallel coil PL up to ground. Together with the bridging inductance BI, the four parallel resonant circuits generate a filter with a transfer behavior, which has two poles which span between them a passband of the bandpass filter. It is also possible to integrate further parallel resonant circuits in a bandpass filter in the manner shown, by means of which further poles can be embodied or the available poles can be amplified.

The terminal capacitors AC serve to set an input impedance or an output impedance. Thus, for example, an input impedance of 5Ω can be set by a terminal capacitor AC with a capacitance of 5 pF in one exemplary embodiment. By raising this capacitance value to e.g. 18 pF, it is possible to set an input impedance of 50Ω without there being a substantial change in the transfer behavior of the filter circuit in the process. However, small adaptations of the values of other components may be required.

FIG. 2B shows a low-pass filter which, like the bandpass filter in FIG. 2A, has a serial signal line SL, four circuit nodes with coupling capacitances arranged therebetween and two terminal capacitances AC at the ends. At the circuit nodes, high-quality tunable capacitors are connected up to ground as reactance elements.

In a block diagram, FIG. 2C shows a tunable filter which is embodied as a high-pass filter. In contrast to the low-pass filter in FIG. 2B, the high-pass filter in FIG. 2C has high-quality inductances as reactance elements. Using tunable high-quality inductances I, it is also possible to embody the high-pass filter as a tunable filter.

FIG. 2D shows a block diagram of a tunable filter embodied as a bandstop filter. Here, series resonant circuits are coupled to the circuit nodes N of the serial line SL as reactance elements, which series resonant circuits comprise a high-quality tunable capacitance CT and, connected in series therewith, a high-quality inductance I. The bandstop filter can be embodied as a notch filter, in which individual frequencies are damped but there is a good pass with little damping in the rest of the range. However, it is also possible for the series resonant circuits SK, which are coupled to one another by way of the coupling capacitors KC, to span a stop band together. Then, the bandstop filter exhibits a good pass behavior in the remaining frequencies on both sides of the stop band.

Figure 2E:
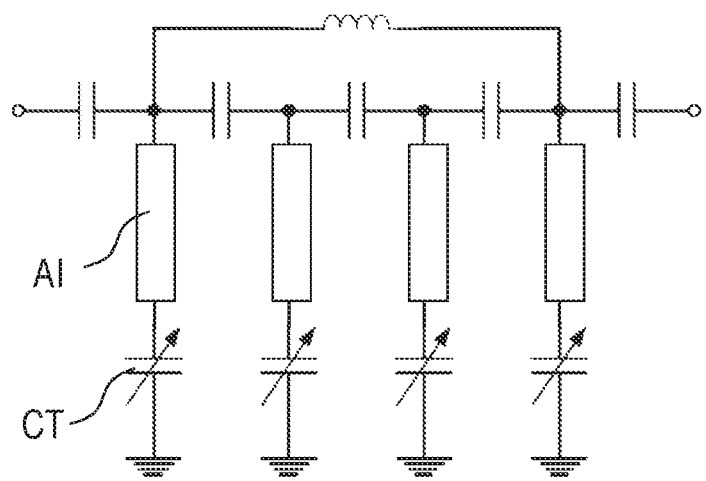

FIG. 2E shows, in a block diagram, a tunable high-pass filter which is realized using admittance inverters AI. In contrast to the low-pass filter in FIG. 2B, the high-pass filter in FIG. 2E in each case has a series connection of an admittance inverter AI and a tunable capacitance CT as tunable reactance elements.

In the embodiments of filters depicted in FIGS. 2A to 2E, the components of the reactance elements are embodied as high-quality components. By way of example, the tunable high-quality capacitors CT are integrated into a semiconductor device HLB and embodied as varactors or switchable capacitors. The inductances in the reactance elements of FIGS. 2A, 2C and 2D are also of high quality and are, in particular, embodied as discrete passive devices DP (see FIG. 1). The remaining passive components within the serial signal line SL, and the bridging inductance BI, can be low-quality components. The admittance inverters AI of the circuit in FIG. 2E are also preferably embodied an interconnection of high-quality passive components.

Figure 3A:
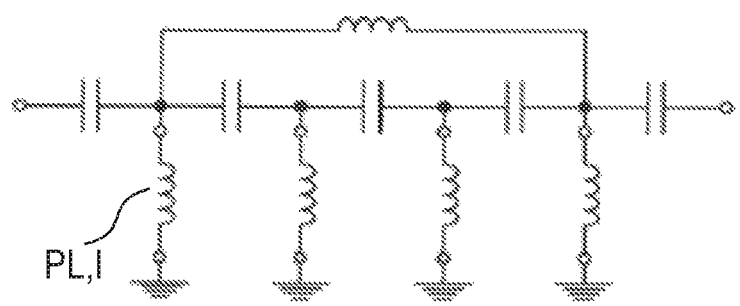
FIGS. 3A and 3B show a possible separation of components of a tunable filter.
Figure 3B:
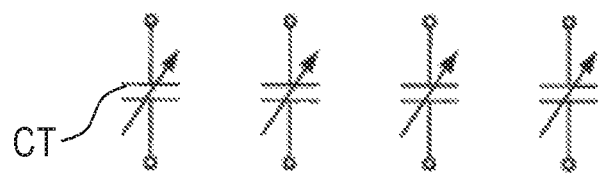

As already indicated in FIG. 1, an advantageous refinement of the invention consists of separating low-quality and high-quality passive components from one another. FIGS. 3A and 3B show, in an exemplary manner, a possible separation of the components for a bandpass filter as depicted in FIG. 2A. In this case, the tunable capacitances CT are combined in one group, integrated on a device or realized in a separate region of a semiconductor device. The low-quality passive components can be realized on an integrated passive device (IPD), which can be arranged like a discrete device in the first or second component plane KE1, KE2 of the package P, as depicted in FIG. 1.

Figure 4A:
FIGS. 4A to 4C show a further possible separation of components of a tunable filter.
Figure 4B:
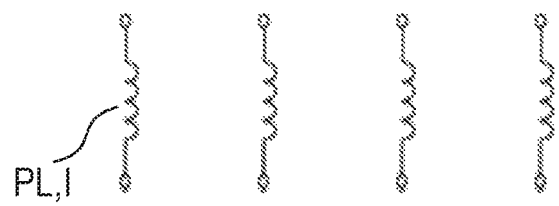

In a further embodiment of the invention, the passive components are subdivided further. A first group of passive components comprises the coupling capacitors and the bridging inductance as in FIG. 4A. The high-quality inductances of the reactance elements in FIGS. 2A, 2C, 2D and 2E form a further group of passive components, which are realized separately, for example as passive discrete devices PD. The tunable capacitances CT in exemplary embodiments 2A, 2B, 2D and 2E form a further group of passive components realized separately, which are integrated into the semiconductor device HLB. Only the high-quality inductances PL, I of FIG. 4B are embodied completely separately and preferably as individual discrete devices.

Figure 4C:
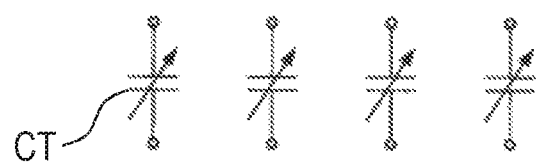

Low-quality passive components and the tunable capacitors of FIG. 4C can be realized separately, for example the tunable capacitances can be realized as a semiconductor device and the low-quality components as an integrated passive device. However, alternatively, it is also possible for the components in FIGS. 4A and 4C to be realized in a common semiconductor device. Furthermore, it is possible to integrate the low-quality passive components into a multi-layer substrate S.

Figure 5:
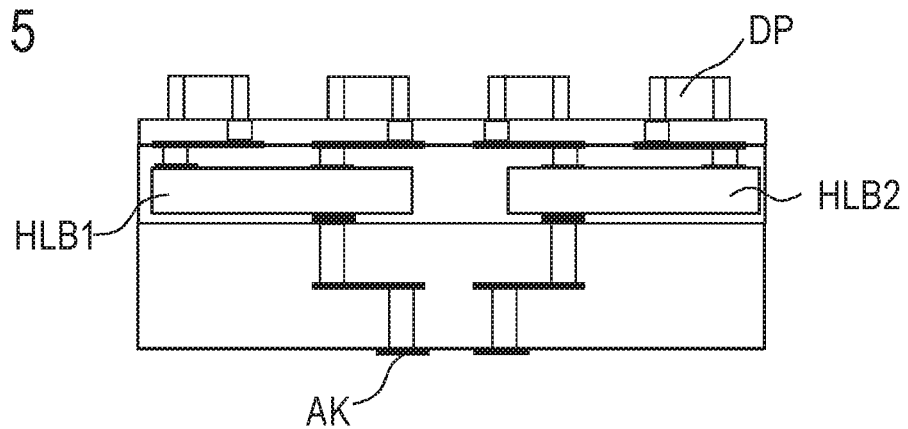
FIG. 5 shows a package with a tunable filter in a schematic cross section.

FIG. 5 shows a schematic cross section of a package which has at least two semiconductor devices HLB1, HLB2 in the first component plane. The individual components as per FIGS. 3B, 4C and 4A can be divided among these two semiconductor devices. Additionally, the control unit can be integrated in one of the two semiconductor devices, which control unit can be embodied as a MIPI-RFFE controller (=mobile industry processor interface—radiofrequency front-end). The MIPI controller, i.e. the control unit, can also be embodied as a separate semiconductor device in the first component plane KE1. In a further embodiment, all passive components with the exception of the high-quality inductances are integrated together with the control unit, e.g. a MIPI-RFFE controller, in a single semiconductor device HLB. The MIPI controller can check all data that are important in mobile communication devices and it can control the components.

The MIPI controller can be realized in the baseband processor or in the RF chipset of the cellular phone.

A control unit can convert the digital MIPI-RFFE signal into specific control signals, e.g. in analog or digital form.

Figure 6:
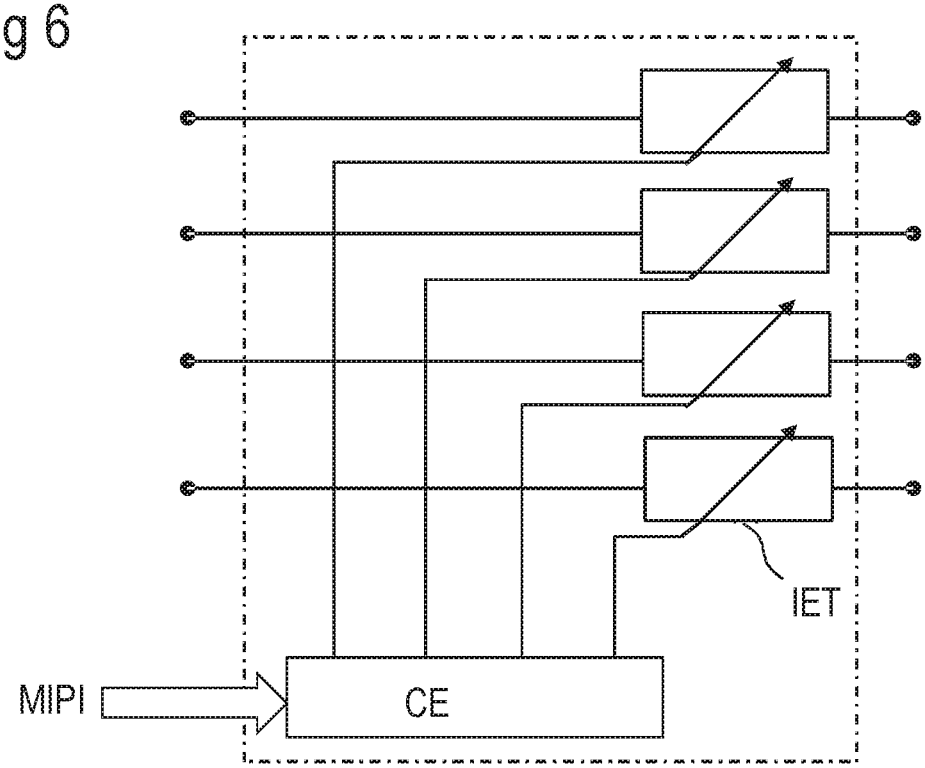
FIG. 6 shows an array of tunable impedance elements and a control unit.

FIG. 6 shows an array of four tunable high-quality impedance elements, which are controlled by a common control unit CE. The arrangement can also have a greater number of tunable impedance elements IET. The tunable impedance elements IET have a tunable impedance. By way of example, they are embodied as tunable capacitances, which are tunable in terms of the capacitance value thereof. The information for tuning can be transmitted to the control unit CE by way of an MIPI-RFFE signal (MIPI), which control unit then undertakes appropriate tuning of the individual tunable capacitors CT or, precisely more generally, appropriate tuning of the impedance elements IET. The tunable impedance elements can be realized with different technologies. The entire arrangement can be realized in a semiconductor device. The control unit CE generates an actuation for the tunable capacitors from the MIPI signal.

Each one of the tunable impedance elements can be part of a tunable reactance element which in turn may constitute an interconnection of a tunable impedance element with one or more further passive components.

Figure 7:
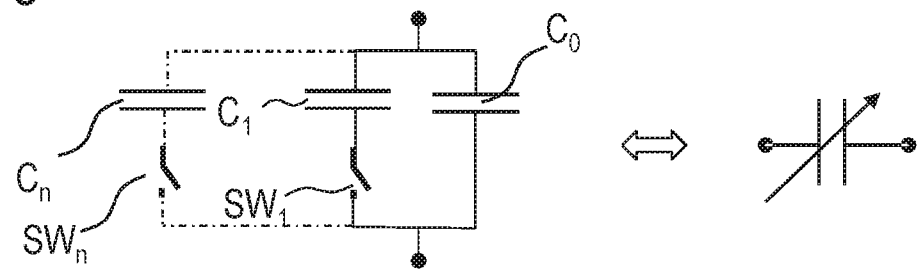
FIG. 7 shows an array of switchable capacitances or capacitors.

FIG. 7 shows an option of how a high-quality tunable capacitance can be embodied as an array of switchable capacitors. In order to set an arbitrary capacitance value, an arbitrary number of capacitors are interconnected with one another in parallel in an array. Possible settable, specific capacitance values emerge from various (partial) sums of the capacitances interconnectable in the array. Depicted in the figure is a capacitor C0. Parallel thereto, a first additional capacitor C1 can be switched in with the aid of a switch SW1. One or more additional capacitors $C_n$ can be interconnected in parallel with the capacitors C0 and C1 by way of switches $SW_n$. By skillful selection of the capacitance values, it is thus possible to obtain very precise fine gradations of the resultant overall capacitance value. While the equivalent circuit for such a switchable capacitor array is depicted on the left, the symbol depicted on the right clarifies an arbitrary tunable capacitor, which can also be realized with a different technology, for example as a varactor.

There is a fundamental difference between switchable capacitors and directly tunable capacitors such as varactors, since the switchable capacitors can be switched digitally while a tunable capacitor such as a varactor is controlled by e.g. an analog signal which is applied to the varactor as a voltage and which is proportional to the achievable capacitance value.

Figure 8:
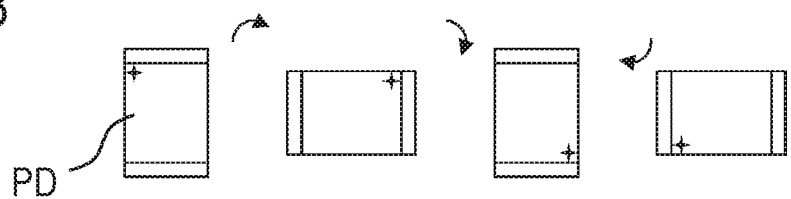
FIG. 8 shows an arrangement of inductive components, which are distinguished by low coupling.

FIG. 8 shows a further refinement of the invention, in which the coupling between adjacent devices is minimized for the discrete devices PD of the second component plane KE2 designed as high-quality inductances. This is achieved by virtue of directly adjacent inductances, which are e.g. embodied as SMD devices, being rotated by 90° with respect to one another in the second component plane. In the figure, a star denotes a virtual position in the device so that the direction of rotation can be read from the figure. It is possible to set a total of four different positions by carrying out, three times, a 90° rotation with in each case the same direction of rotation, and hence it is possible to obtain minimal coupling between the inductances.

In a further package (not depicted here), the passive components of the tunable filter are all arranged in the first component plane KE1 and, for example, realized as devices assembled on the substrate S using a flip-chip construction. Here, different devices can be assembled, in which the passive components and the controller are realized separately from one another. The low-quality passive elements can be integrated into the substrate, but they can also be realized together with other components in a device in the first component plane. At least the low-quality passive components can be realized as an integrated passive device IPD.

The devices assembled using a flip-chip construction can also be provided with a passivation, a cover or a housing which, in principle, can be realized like in the aforementioned embodiments.

The invention is not restricted to the embodiments described in more detail in the exemplary embodiments, but only defined by the wording of the main claim. Individual new features in the claims, and sub-combinations thereof, are also considered to be in accordance with the invention.

The invention claimed is:

1. A package for a tunable filter, the package comprising:
   a substrate comprising a first interconnection plane;
   a semiconductor device assembled on the substrate in a first component plane, the semiconductor device electrically connected to the first interconnection plane and comprising tunable passive components;
   a control unit arranged in the first component plane;
   a dielectric layer arranged above the first component plane;
   a second component plane arranged on the dielectric layer; and
   discrete passive devices arranged in the second component plane and interconnected with the semiconductor device,
   wherein the tunable passive components are tunable by the control unit, and
   wherein the tunable passive components, the control unit and the discrete passive devices realize the filter which is tunable in respect of a passband.

2. The package according to claim 1, wherein the control unit is integrated into the semiconductor device together with the tunable passive components.

3. The package according to claim 1, wherein the substrate has a lower surface, facing away from the first component plane, including external contacts, and wherein the external contacts and the tunable filter are electrically contacted by via holes and conductor tracks.

4. The package according to claim 1, further comprising additional passive components integrated into the substrate.

5. The package according to claim 1, further comprising further components integrated into the package and arranged in the first or second component plane, wherein the further components are selected from the group consisting of a power amplifier, an LNA, an acoustic filter, a duplexer, a diplexer and an RF semiconductor device.

6. The package according to claim 1, wherein the tunable passive components are tunable capacitors, wherein the tunable capacitors are selected from a group consisting of varactors and switchable capacitances, and wherein the discrete passive devices are inductances.

7. The package according to claim 6, wherein the switchable capacitances are embodied as an array of switchable MEMS capacitors or switchable MIM capacitors.

8. The package according to claim 6, wherein the inductances are embodied as SMD components, each having a magnetic axis, wherein the SMD components are arranged linearly in such a way that magnetic axes of two of the SMD components arranged next to one another are rotated by approximately 90° with respect to one another.

9. The package according to claim 1, further comprising a serial signal line, wherein the serial signal line has at least 4 circuit nodes, wherein each of the at least 4 circuit nodes has a parallel branch coupled to ground, and wherein a respective tunable reactance element is arranged in each parallel branch.

10. The package according to claim 9, wherein the respective tunable reactance element is a parallel resonant circuit, wherein each parallel resonant circuit comprises a parallel connection of a tunable capacitor and an inductance.

11. The package according to claim 9, wherein the respective tunable reactance element is a series inductance.

12. The package according to claim 9, wherein the respective tunable reactance element is a tunable capacitance.

13. The package according to claim 9, wherein the respective tunable reactance element is a series connection of a tunable capacitance and an inductance.

14. The package according to claim 9, wherein the respective tunable reactance element is a series connection of an admittance inverter and a tunable capacitance.

15. The package according to claim 9, wherein a coupling capacitance is arranged in the serial signal line between two adjacent circuit nodes of the at least 4 circuit nodes.

16. The package according to claim 15, wherein circuit nodes of the at least four circuit nodes, which are arranged at an end on both sides of the serial signal line, are connected via a bridging inductance connected in parallel with the serial signal line.

17. The package according to claim 9, wherein a coupling inductance is arranged in the serial signal line between two adjacent circuit nodes of the at least 4 circuit nodes.

18. The package according to claim 17, wherein end circuit nodes of the at least 4 circuit nodes are connected by a bridging capacitance connected in parallel with the serial signal line.

19. The package according to claim 16, wherein the coupling capacitances and the bridging inductance are integrated into the semiconductor device.

20. The package according to claim 16, wherein the coupling capacitances and the bridging inductance are embodied as an integrated passive element (IPD) and arranged in the first component plane.

21. The package according to claim 20, wherein the substrate or the integrated passive element is selected from a group consisting of an LTCC ceramic, an HTCC ceramic, or a laminate.

* * * * *